(12) United States Patent
Chan et al.

(10) Patent No.: US 8,716,744 B2
(45) Date of Patent: May 6, 2014

(54) LED PACKAGE, METHOD FOR MAKING THE LED PACKAGE AND LIGHT SOURCE HAVING THE SAME

(75) Inventors: Shiun-Wei Chan, Hsinchu (TW); Chih-Hsun Ke, Hsinchu (TW); Chao-Hsiung Chang, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 74 days.

(21) Appl. No.: 13/286,084

(22) Filed: Oct. 31, 2011

(65) Prior Publication Data

US 2012/0241789 A1   Sep. 27, 2012

(30) Foreign Application Priority Data

Mar. 22, 2011 (CN) .......................... 2011 1 0069235

(51) Int. Cl.
*H01L 33/00* (2010.01)

(52) U.S. Cl.
USPC ......... 257/100; 257/98; 257/99; 257/E23.128

(58) Field of Classification Search
USPC ................. 257/100, 98, 99, E23.128
See application file for complete search history.

(56) References Cited

U.S. PATENT DOCUMENTS 6,897,490 B2 * 5/2005 Brunner et al. ................. 257/98

* cited by examiner

*Primary Examiner* — Amar Movva
(74) *Attorney, Agent, or Firm* — Novak Druce Connolly Bove + Quigg LLP

(57) ABSTRACT

An LED package includes a light transmissive encapsulation, an LED die, a fluorescent layer, a baffle wall, a positive electrode and a negative electrode. The encapsulation includes a light emitting surface and a bottom surface opposite to the light emitting surface. The LED die, the fluorescent layer and the baffle wall are embedded in the encapsulation from the bottom surface side. The LED die includes a front surface for outputting light outward and a back surface opposite to the front surface. The front surface faces the light emitting surface of the encapsulation, and the back surface is exposed outside. The fluorescent layer is formed on the front surface of the LED die. The baffle wall surrounds the LED die and the fluorescent layer. The positive electrode and negative electrode are electrically connected to the LED die.

11 Claims, 14 Drawing Sheets

LED PACKAGE, METHOD FOR MAKING THE LED PACKAGE AND LIGHT SOURCE HAVING THE SAME

BACKGROUND

1. Technical Field

The present disclosure generally relates to light emitting diode (LED) packages, method for making the LED package and light source having the same.

2. Description of Related Art

With the continuing development of scientific technology and the rise of people's consciousness of energy saving, LEDs have been widely used in the field of illumination due to their small size and high efficiency. However the LEDs generate a great deal of heat when electrically driven to emit light. Therefore, how to effectively cool down the temperature of the LEDs when electrically driven so as to increase light emitting efficiency, improve luminance, and extend longer service life has become an issue pending urgent solution in the trade.

Therefore, it is necessary to provide an LED package which can overcome the shortcomings of the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

FIG. 7-FIG. 13 are schematic, cross-sectional views showing various steps of a method for making the light emitting chip package of FIG. 4, while

DETAILED DESCRIPTION

Reference will now be made to the drawings to describe the present LED packages, method for making the LED packages and light sources having the LED packages, in detail.

Figure 1:
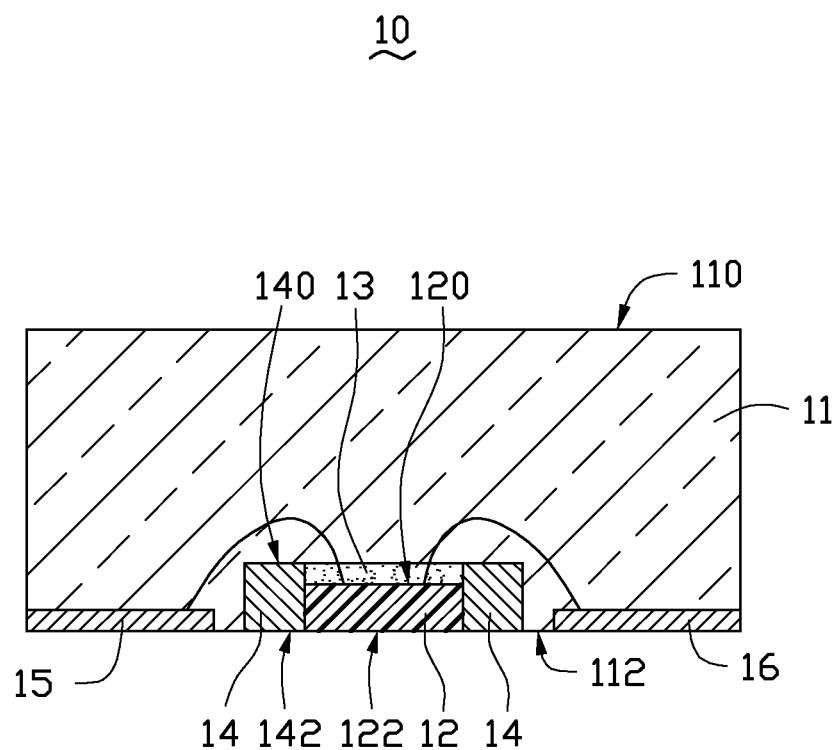
FIG. 1 is a schematic, cross-sectional view of an LED package in accordance with a first embodiment of the present disclosure.

Referring to FIG. 1, an LED package 10 according to a first embodiment includes an encapsulation 11, an LED die 12, a fluorescent layer 13, a baffle wall 14, a positive electrode 15, and a negative electrode 16.

The encapsulation 11 is made of light transssmissive materials, such as polycarbonate (PC), polymethyl methacrylate (PMMA) and so on. The encapsulation 11 includes a light emitting surface 110, and a bottom surface 112 opposite to the light emitting surface 110.

The LED die 12 includes a front surface 120, and a back surface 122 opposite to the front surface 120. The front surface 120 is for outputting light. The back surface 122 is for dissipating heat outward. The LED die 12 is embedded in the encapsulation 11 via the bottom surface 112 thereof, with the back surface 122 of the LED die 12 being coplanar with the bottom surface 112 of the encapsulation 11. As such, the front surface 120 faces the light emitting surface 110 while is covered by the encapsulation 11, and the back surface 122 is exposed to an external environment via the bottom surface 112. In this embodiment, the back surface 122 and the bottom surface 112 are both planar surfaces.

The fluorescent layer 13 is embedded in the encapsulation 11 and arranged on the front surface 120 of the LED die 12. The fluorescent layer 13 is for emitting light when activated by light emitted from the LED die 12.

The baffle wall 14, which generally has a hollow cylindrical configuration, is embedded in the encapsulation 11 from the bottom surface 112, to surround the LED 12 and the fluorescent layer 13. The baffle wall 14 includes a first end surface 140, and a second end surface 142 opposite to the first end surface 140. The first end surface 140 faces the light emitting surface 110 of the encapsulation 11. The second end surface 142 faces away from the light emitting surface 110 of the encapsulation 11. The second end surface 142 is coplanar with the bottom surface 112 of the encapsulation 11, and exposed to the external environment. In this embodiment, the baffle wall 14 is made of light transmissive materials.

The positive and negative electrodes 15 and 16 are respectively connected to anode and cathode (not illustrated) of the LED die 12 by metal wire 17. The positive and negative electrodes 15 and 16 can both be planar plate, convenient for fabricating. The positive and negative electrodes 15 and 16 are arranged on the bottom surface 112 of the encapsulation 11, and embedded in the encapsulation 11 from the bottom surface 112 side.

Figure 2:
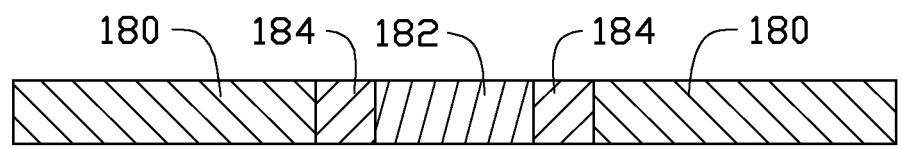
FIG. 2 is a schematic, cross-sectional view of a circuit board matching the LED package of FIG. 1.

Referring to FIG. 2, a circuit board 18 matching the LED package 10 is provided. The circuit board 18 includes circuit traces 180, a heat conductor 182 located at a middle of the circuit board 18, and at least one isolator 184 located between and electrically isolating the heat conductor 182 from the circuit traces 180.

Figure 3:
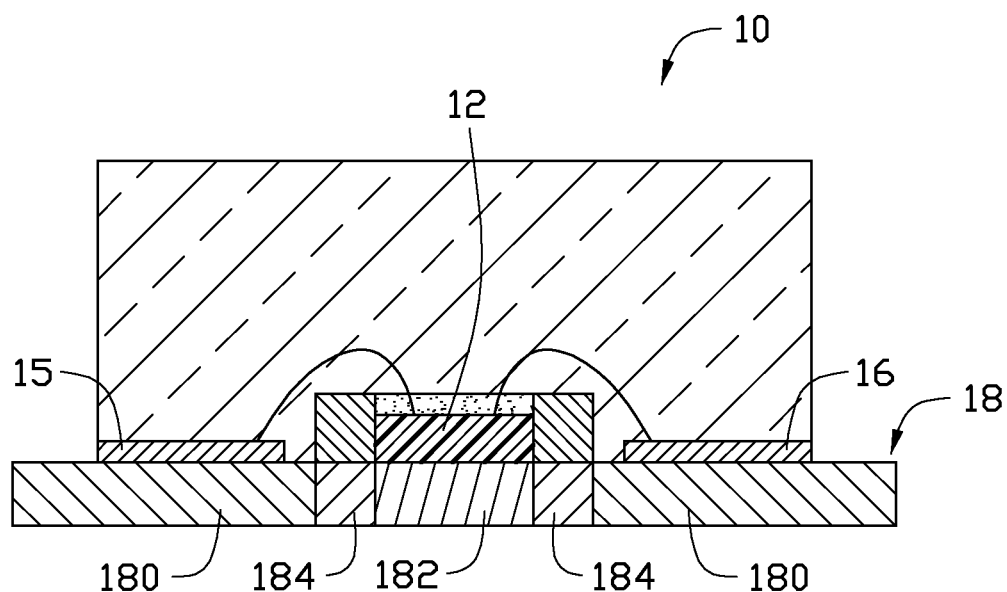
FIG. 3 is a schematic, cross-sectional view of the LED package of FIG. 1 mounted on the circuit board of FIG. 2.

Referring to FIG. 3, the LED package 10 is mounted on the circuit board 18. The circuit traces 180 contacts the positive and negative electrodes 15 and 16, thereby providing electrical power to the LED die 12. The heat conductor 182 is made of materials with high thermal conductivity, for example metal. The heat conductor 182 is for transferring heat generated by the LED die 12 from one side of the circuit board 18 to another opposite side of the circuit board 18. The isolator 184 is electrically insulating. As such, the isolator 184 electrically isolates the circuit traces 180 from the heat conductor 182 to avoid short circuit of the circuit traces 180. The isolator 184 can be made of light reflective materials. As such, light incident on the isolator 184 can be reflected towards the light emitting surface 110 of the encapsulation 11, thereby enhancing light extraction efficiency of the LED package 10.

Due to that the back surface 122 of the LED die 12 is exposed outside, the LED die 12 has its back surface 122 directly contact the heat conductor 182 when mounted to the circuit board 18. Accordingly, heat generated by the LED die 12 can be transferred, via the heat conductor 182, from the back surface 122 to a distal side of the circuit board 18 away from the LED die 12. Thereby, high efficiency of heat dissipation is achieved. In addition, the LED package 10 can be further equipped with heat sinks or/and heat pipes at the distal side of the circuit board 18 away from the LED die 12, thereby further helping heat dissipation from the heat conductor 182.

Figure 4:
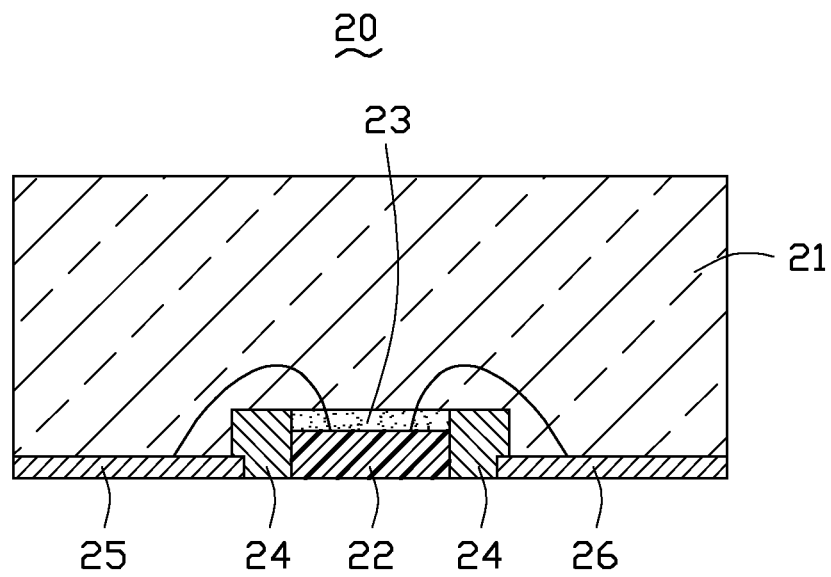
FIG. 4 is a schematic, cross-sectional view of an LED package in accordance with a second embodiment of the present disclosure.

Referring to FIG. 4, an LED package 20 according to a second embodiment is provided.

The LED package 20 has a configuration similar to the LED package 10 of the first embodiment. The LED package 20 also includes an encapsulation 21, an LED die 22, a fluorescent layer 23, a baffle wall 24, a positive electrode 25, and a negative electrode 26. The difference from the LED package 10 is that the baffle wall 24 of the LED package 20 partly overlaps the positive electrode 25 and the negative electrode 26, thereby enhancing bonding strength of the positive electrode 25 and the negative electrode 26 in the LED package 20.

Figure 5:
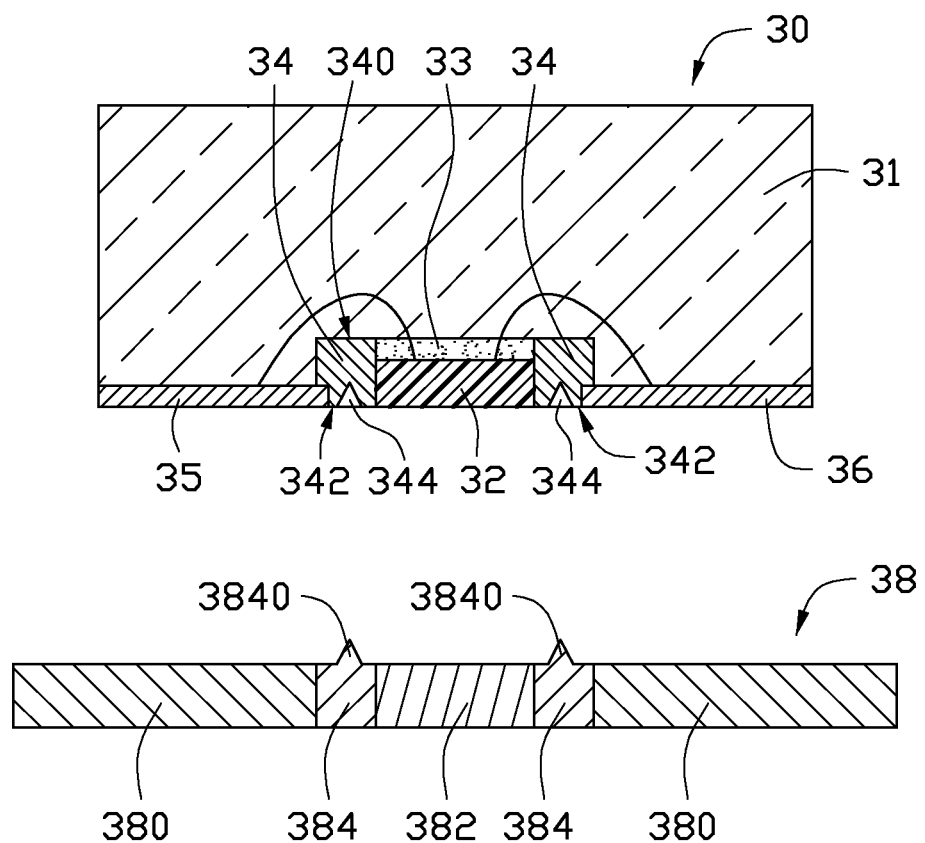
FIG. 5 is a schematic, cross-sectional view of an LED package and a circuit board in accordance with a third embodiment of the present disclosure.

Referring to FIG. 5, an LED package 30 and a circuit board 38 according to a third embodiment are provided.

The LED package 30 has a configuration generally similar to the LED package 20 of the second embodiment. The LED package 30 also includes an encapsulation 31, an LED die 32, a fluorescent layer 33, a baffle wall 34, a positive electrode 35, and a negative electrode 36. The difference from the LED package 20 is that a second end surface 342 of the baffle wall 34 further defines at least one groove 344 therein. The at least one groove 344 extends from the second end surface 342 towards a first end surface of the baffle wall 34 to reach an interior of the baffle wall 34.

The circuit board 38 has a configuration generally similar to the circuit board 18 of the first embodiment. The circuit board 38 also includes circuit traces 380, a heat conductor 382 located at a middle of the circuit board 38, and at least one isolator 384 located between and electrically isolating the heat conductor 382 from the circuit traces 380. The difference from the circuit board 18 is that the isolator 384 further includes at least one protrusion 3840 corresponding to the at least one groove 344. The at least one protrusion 3840 has a shape and size the same as those of the at least one groove 344. Accordingly, the at least one protrusion 3840 can extend into the groove 344 and engage in the at least one groove 344 when the LED package 30 is mounted on the circuit board 38, thereby enhancing connecting strength between the LED package 30 and the circuit board 38.

Figure 6:
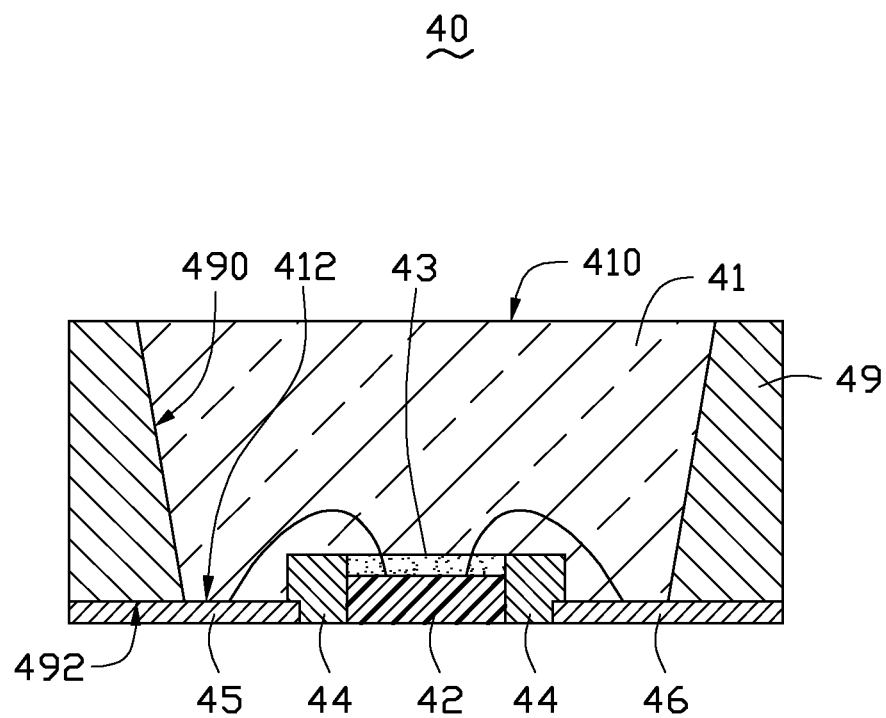
FIG. 6 is a schematic, cross-sectional view of an LED package in accordance with a fourth embodiment of the present disclosure.

Referring to FIG. 6, an LED package 40 according to a fourth embodiment is provided.

The LED package 40 has a configuration similar to that of the LED package 20 of the second embodiment. The LED package 40 also includes an encapsulation 41, an LED die 42, a fluorescent layer 43, a baffle wall 44, a positive electrode 45, and a negative electrode 46. The difference from the LED package 20 is that the LED package 40 further includes a reflective cup 49. The reflective cup 49 has a generally annular configuration. The reflective cup 49 defines a receiving hole 490 at a central position thereof. The receiving hole 490 tapers from an upper side adjacent to a light emitting surface 410 of the encapsulation 41 to a bottom side adjacent to a bottom surface 412 of the encapsulation 41. The receiving hole 490 receives the encapsulation 41, the LED die 42, the fluorescent layer 43 and the baffle wall 44 therein.

In this embodiment, the reflective cup 49 includes a bottom 492 adjacent to the bottom surface 412 of the encapsulation 41. The positive electrode 45 and the negative electrode 46 cover the bottom 492 of the reflective cup 49 and the bottom surface 412 of the encapsulation 41.

The present disclosure further provides a method for making the LED package 20 of FIG. 4. The method includes:

Step 1: providing a temporary substrate, arranging an LED die, a positive electrode and a negative electrode on the temporary substrate, the positive electrode and the negative electrode being at two sides of the LED die and separated from each other;

Step 2: forming a baffle wall surrounding the LED die and isolating the LED die from the positive electrode and the negative electrode;

Step 3: electrically connecting the LED die with the positive electrode and the negative electrode;

Step 4: forming a fluorescent layer on a light outputting surface of the LED die;

Step 5: covering the LED die, the baffle wall, the fluorescent layer, the positive electrode and the negative electrode with an encapsulation; and Step 6: removing the temporary substrate.

Figure 7:
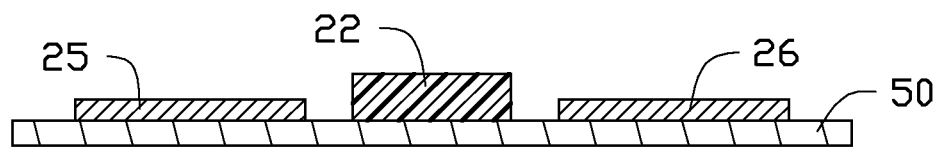

In step 1, referring to FIG. 7, a temporary substrate 50 is provided. An LED die 22 is arranged on the temporary substrate 50. A positive electrode 25 and a negative electrode 26 are arranged at two sides of the LED die 22 respectively, and isolated from each other.

Figure 8:
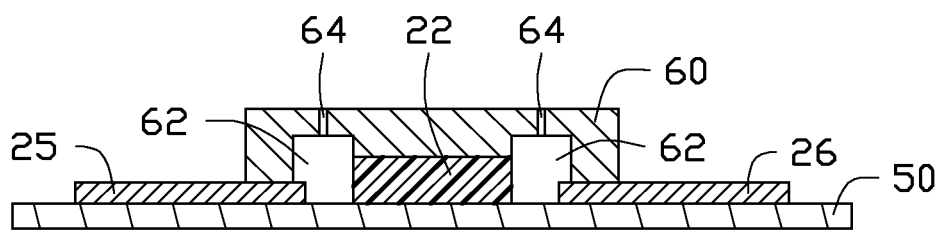
Figure 9:
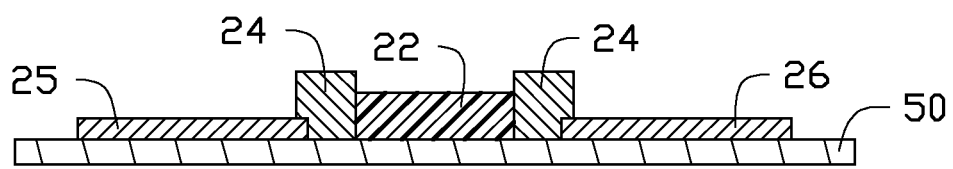

In step 2, a baffle wall 24 is formed on the temporary substrate 50. The baffle wall 24 surrounds the LED die 22, and isolates the LED die 22 from the positive electrode 25 and the negative electrode 26. In detail, referring to FIG. 8, a mold 60 is arranged on the LED die 22 and the positive and negative electrodes 25, 26 with two chambers 62 being defined at lateral sides of the LED die 22. Two openings 64 are defined in the mold 60 and communicate the two chambers 62 with an external environment. After filling the two chambers 62 for example with light transmissive materials via the two openings 64, the baffle wall 24 is formed by solidifying the filled materials, as illustrated in FIG. 9. In this embodiment, the baffle wall 24 has an upper end higher than a top surface of the LED die 22.

Figure 10:
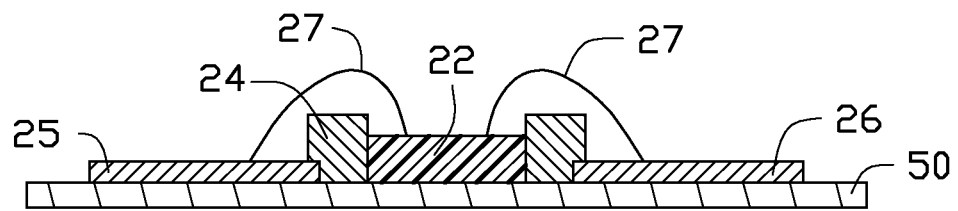

In step 3, referring to FIG. 10, the LED die 22 is wire bonded to the positive electrode 25 and the negative electrode 26 by metal wires 27.

Figure 11:
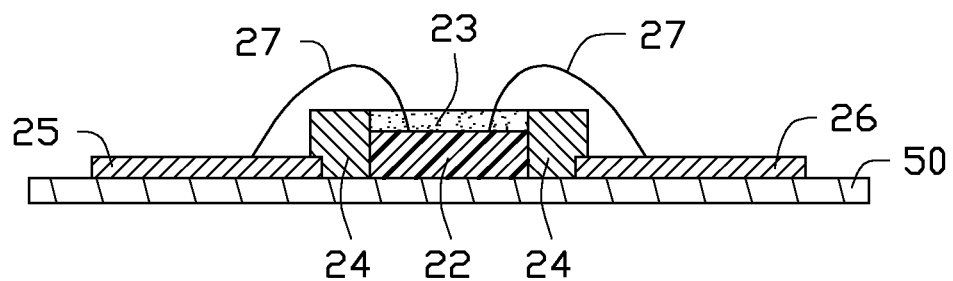

In step 4, referring to FIG. 11, a fluorescent layer 23 is formed on the top surface of the LED die 22, which is for outputting light from the LED die 22. In this embodiment, the fluorescent layer 23 has a top surface coplanar with the upper end of the baffle wall 24.

Figure 12:
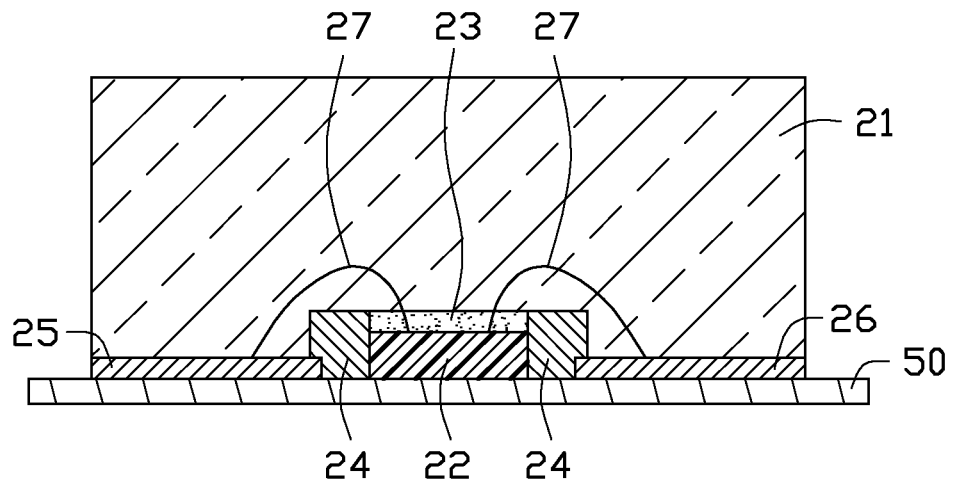

In step 5, referring to FIG. 12, an encapsulation 21 is formed to cover the LED die 22, the baffle wall 24, the fluorescent layer 23, the positive electrode 25, and the negative electrode 26.

Figure 13:
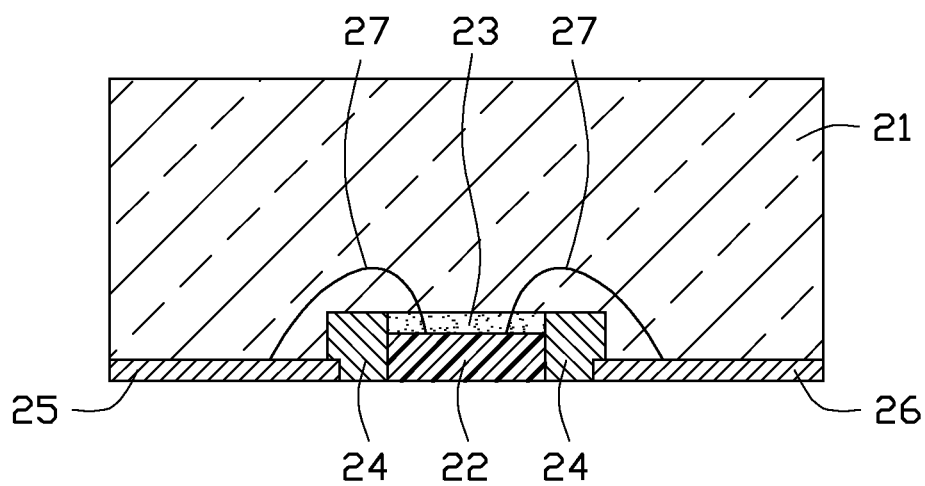

In step 6, referring to FIG. 13, an LED package 20 is achieved by removing the temporary substrate 50.

It is to be said that, in step 2, the materials filled in the chambers 62 can be doped with fluorescent substance therein, thereby making the baffle wall 24 have a light wavelength converting function.

Figure 14:
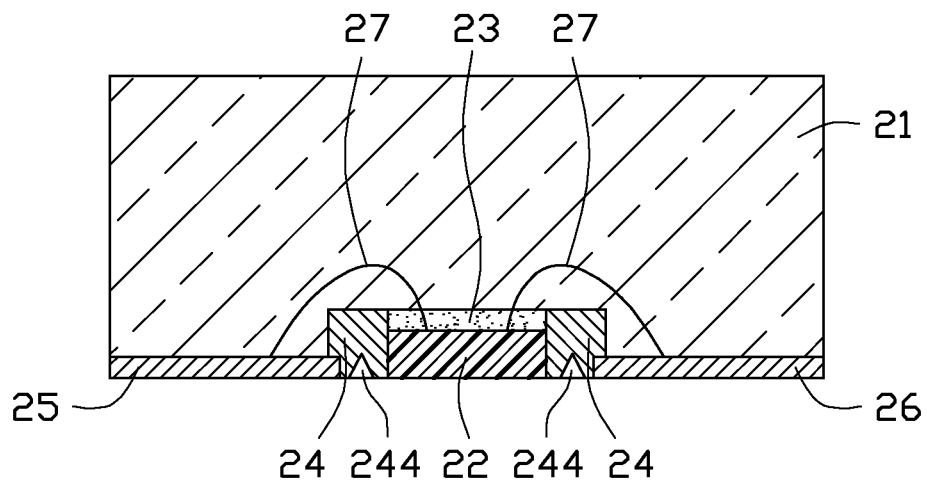
FIG. 14 shows a light emitting chip package formed by the method but having a modified structure by performing a further processing step to the light emitting chip package of FIG. 4.

In addition, the method can further include a step of forming at least one groove 244 on a lower end surface of the baffle wall 24 after step 6, as illustrated in FIG. 14. Accordingly, the groove 244 can be used to form engagement with the circuit board 38 of FIG. 5 which has at least one protrusion 3840 configured on the isolator 384 thereof.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package comprising:
a light transmissive encapsulation, the encapsulation comprising a light emitting surface and a bottom surface opposite to the light emitting surface;
an LED die embedded in the encapsulation, the LED die comprising a front surface for outputting light outward and a back surface opposite to the front surface, the front surface facing the light emitting surface of the encapsulation, the back surface being exposed outside;
a fluorescent layer embedded in the encapsulation and formed on the front surface of the LED die;
a baffle wall embedded in the encapsulation, the baffle wall surrounding the LED die and the fluorescent layer, the baffle wall being made of light transmissive materials;
a positive electrode electrically connected to an anode of the LED die; and
a negative electrode electrically connected to a cathode of the LED die.

2. The LED package according claim 1, wherein the baffle wall comprises a first end surface and a second end surface opposite to the first surface, the first end surface facing the light emitting surface of the encapsulation, the second end surface facing away from the light emitting surface.

3. The LED package according claim 2, wherein the second end surface defines a groove therein, the groove extending from the second end surface towards the first end surface.

4. The LED package according claim 2, wherein the back surface of the LED die is coplanar with the bottom surface of the encapsulation, and the second end surface of the baffle wall is coplanar with the bottom surface of the encapsulation.

5. The LED package according claim 1, wherein the baffle wall has fluorescent substance doped therein.

6. The LED package according claim 5, further comprising an annular reflective cup, the reflective cup defining a receiving hole, the receiving hole tapering from an upper side to a bottom side, the receiving hole receiving the encapsulation, the LED die, the fluorescent layer and the baffle wall therein.

7. The LED package according claim 6, wherein the reflective cup comprises a bottom adjacent the bottom surface of the encapsulation, the positive electrode and the negative electrode covering the bottom of the reflective cup and the bottom surface of the encapsulation.

8. The LED package according claim 1, wherein the baffle wall partly overlaps the positive electrode and the negative electrode.

9. A light source comprising:
a circuit board comprising circuit traces, a heat conductor located at a middle of the circuit board, and an isolator located between and electrically isolating the heat conductor from the circuit traces; and
an LED package mounted on the circuit board;
wherein the LED package comprises:
a light transmissive encapsulation, the encapsulation comprising a light emitting surface and a bottom surface opposite to the light emitting surface;
an LED die embedded in the encapsulation, the LED die comprising a front surface for outputting light outward and a back surface opposite to the front surface, the front surface facing the light emitting surface of the encapsulation, the back surface being exposed outside;
a fluorescent layer embedded in the encapsulation and formed on the front surface of the LED die;
a baffle wall embedded in the encapsulation, the baffle wall surrounding the LED die and the fluorescent layer;
a positive electrode electrically connected to an anode of the LED die; and
a negative electrode electrically connected to a cathode of the LED die; and
wherein the positive electrode and the negative electrode of the LED package respectively contact the circuit traces, the back surface of the LED die contacting the heat conductor.

10. The light source according claim 9, wherein the isolator is made of light reflective materials.

11. The light source according claim 9, wherein the baffle wall comprises a first end surface and a second end surface opposite to the first surface, the first end surface facing the light emitting surface of the encapsulation, the second end surface facing away from the light emitting surface, the second surface defining a groove therein, the groove extending from the second end surface towards the first end surface, the isolator having a part extruding into the groove.

* * * * *